United States Patent

[11] 3,582,802

[72] Inventors Barret B. Weekes
Newport Beach;
William E. Shoemaker, Fullerton, both of, Calif.

[21] Appl. No. 846,642
[22] Filed July 16, 1969
[45] Patented June 1, 1971
[73] Assignee Beckman Instruments Inc.
Continuation of application Ser. No. 496,878, Oct. 18, 1965, now abandoned.

[54] DIRECT COUPLED DIFFERENTIAL TRANSISTOR AMPLIFIER WITH IMPROVED COMMON MODE PERFORMANCE
12 Claims, 4 Drawing Figs.

Figure 1:
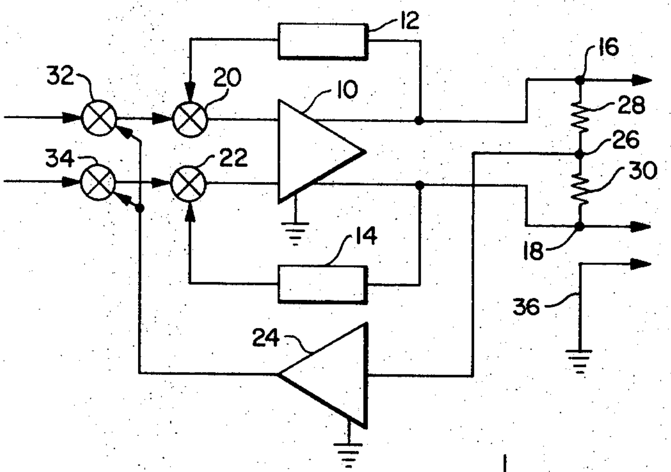

[52] U.S. Cl. ........ 330/30, 330/26
[51] Int. Cl. ........ H03f 1/38, H03f 3/68
[50] Field of Search ........ 330/25, 26, 30, 30 D, 69, 85

[56] References Cited
UNITED STATES PATENTS

| | | | |
|---|---|---|---|
| 3,346,817 | 10/1967 | Walker et al. | 330/69X |
| 3,395,358 | 7/1968 | Petersen | 330/30 |
| 3,444,476 | 5/1969 | Leidich | 330/30X |
| 3,189,840 | 6/1965 | Braymer et al. | 330/25 |
| 3,370,245 | 2/1968 | Royce et al. | 330/25 |

*Primary Examiner*—John Kominski
*Assistant Examiner*—Lawrence J. Dahl
*Attorneys*—Robert J. Steinmeyer and R. M. Jennings ABSTRACT: A direct coupled multistage differential amplifier having high common mode rejection including means for deriving the common mode signal from the last differential stage and coupling such signal back to the first stage and at least one additional stage by way of a feedback path having a gain greater than one. The derived common mode signal is connected through the feedback path to at least one voltage point of the power supply being impressed across the differential stages to drive the power supply voltage in sympathy with the common mode signal appearing at the differential signal input.

BARRET B. WEEKES
WILLIAM E. SHOEMAKER
INVENTORS

BY T E Kristofferson

ATTORNEY

BARRET B. WEEKES
WILLIAM E. SHOEMAKER
*INVENTORS*

BY T E Kristofferson
ATTORNEY

DIRECT COUPLED DIFFERENTIAL TRANSISTOR AMPLIFIER WITH IMPROVED COMMON MODE PERFORMANCE

This is a continuation of application, Ser. No. 496,878, filed Oct. 18, 1965 now abandoned.

This invention relates to a direct coupled differential transistor amplifier having improved common mode performance and more particularly, to such an amplifier having both high common mode rejection and high common mode input impedance where common mode rejection is defined as the useful differential mode gain multiplied by the ratio of common mode voltage at the amplifier input terminals to the resulting amplifier output voltage.

Several attempts have been made in the prior art to provide a low-cost direct coupled differential transistor amplifier having a performance comparable to the performance of amplifiers which employ choppers or modulators, for such applications as amplifier-per-channel data acquisition. Such an amplifier should have high differential mode gain accuracy, large common mode voltage toleration and rejection, a differential input if not floating, a high differential input impedance, a very high common mode input impedance in the order of $10^9$ ohms, and a ground-referenced output. Prior art attempts to design such an amplifier are shown in U.S. Pat. Nos. 3,046,487 to Matzen et al. and 3,189,840 to Braymer et al.

Accordingly, it is an object of this invention to provide such a direct coupled differential transistor amplifier with improved high common mode rejection and high common mode input impedance.

Another object of the invention is to provide such an amplifier employing high gain common mode feedback from the output to the input with resulting high rejection of common mode signals and high common mode input impedance.

A further object of the invention is to provide such an amplifier in which the upper voltage level of the collector circuit of the first differential stage and a number of subsequent stages follows any change in common mode voltage, such that the collector to emitter voltages of the transistors in the first differential stage are virtually unchanged by a common mode input signal, with resulting prevention of generation of a differential mode signal by the common mode signal.

In carrying out this invention in one form thereof, a direct coupled differential transistor amplifier, having a plurality of stages including at least two differential voltage amplifying stages, is provided in which a common mode feedback path having a gain substantially greater than one is connected from a summing junction containing only the common mode signal amplified and present at the output in the last of the plurality of stages to the first differential voltage amplifying stage, and in which at least the collector circuit of the first differential voltage amplifying stage and the circuit of one pair of like electrodes of a subsequent differential voltage amplifying stage are caused to change in accordance with any changes in common mode voltage, by connecting them to a bus which rises and falls with the common mode voltage riding on the required fixed DC bias, so that the collector-emitter voltages across the transistors in the first differential stage are unchanged by common mode variations.

Figure 2:
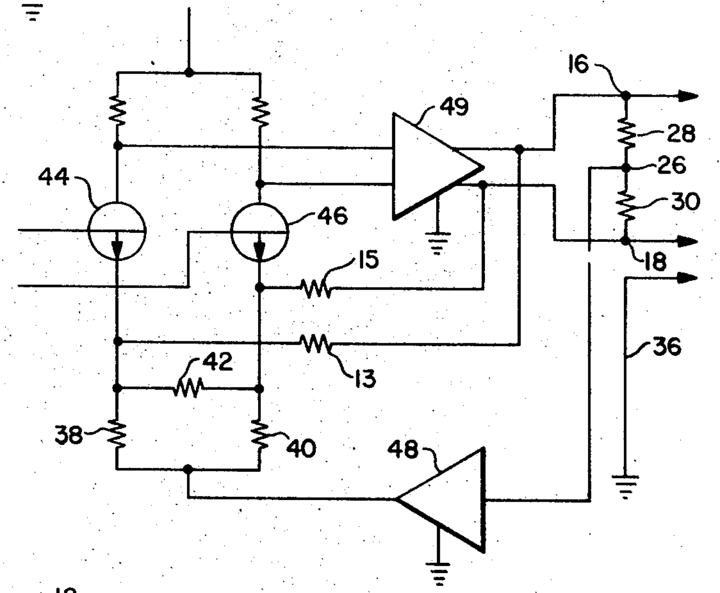
Figure 3:
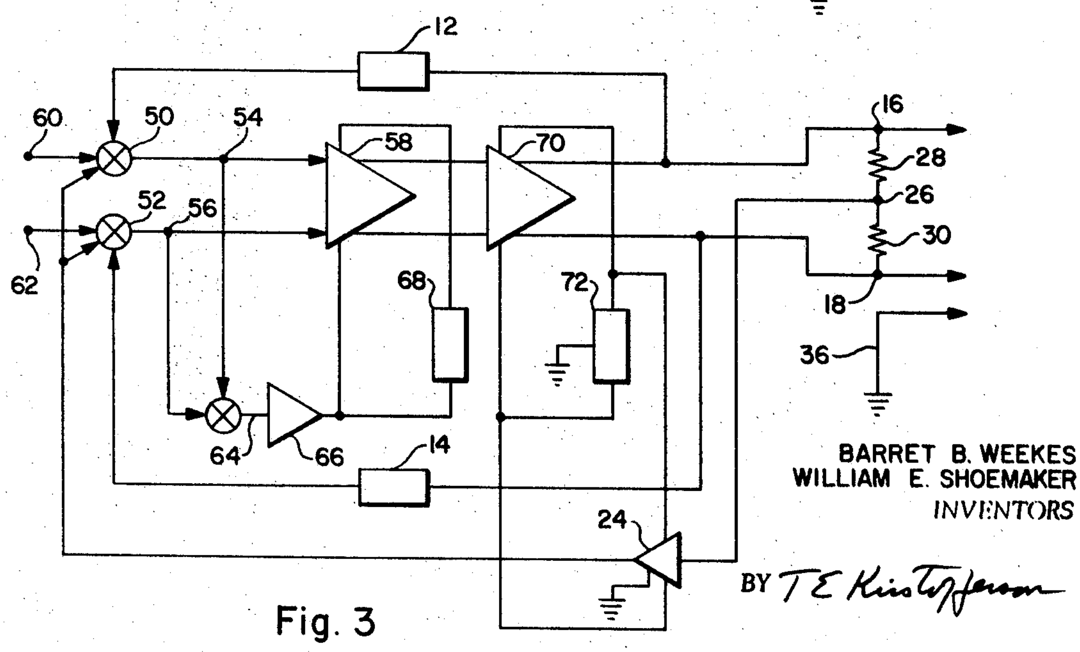
Figure 4:
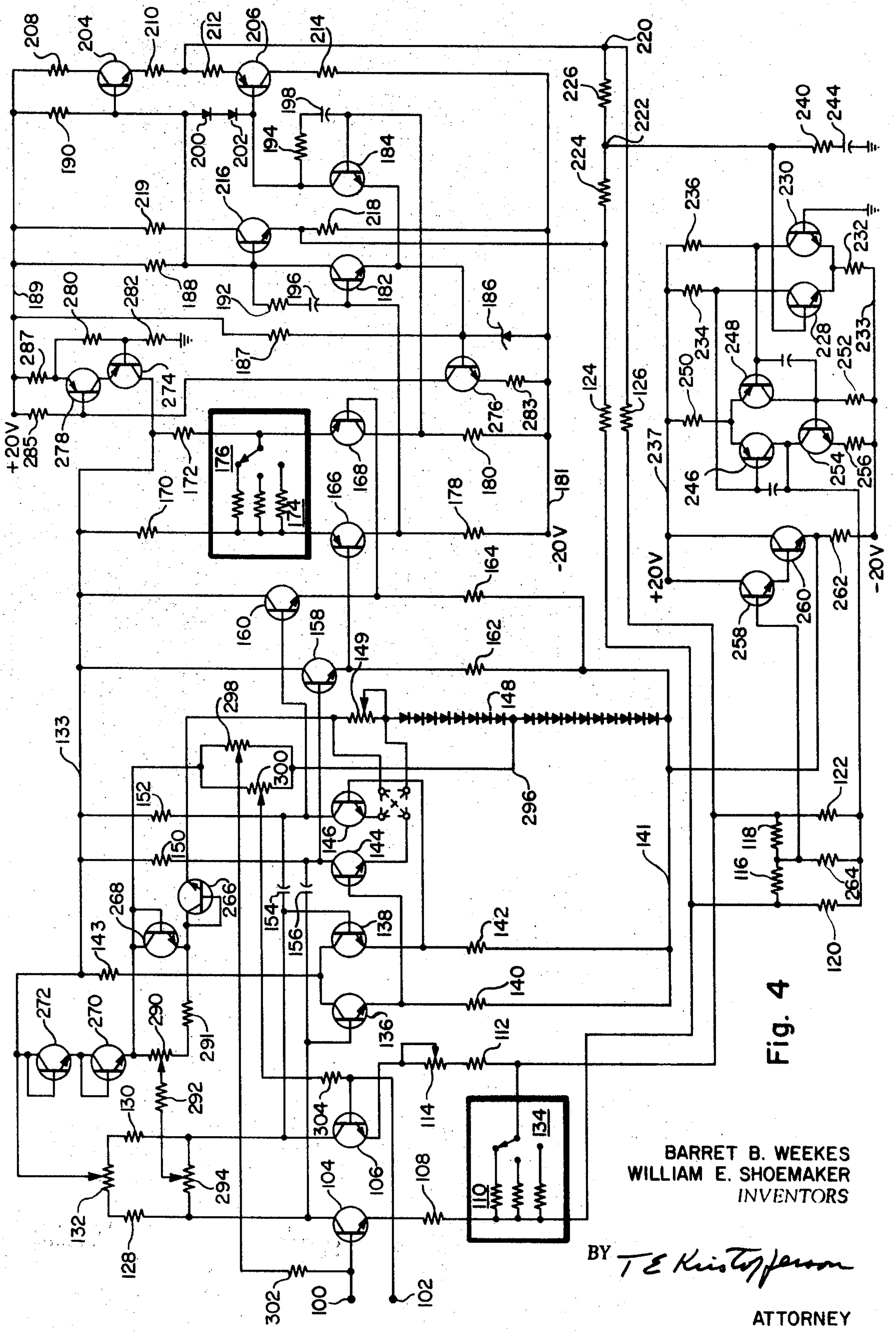

The novel features which are believed to be characteristic of the invention are set forth with particularity in the appended claims. The invention and further objects and advantages thereof can best be understood by reference to the following description and accompanying drawings in which FIG. 1 is a block diagram of that portion of an amplifier, in accordance with the invention, which provides high common mode rejection and high common mode input impedance;

FIG. 2 is a diagram, partly in block and partly in schematic, showing the front end components of the circuits of FIG. 1 in more detail;

FIG. 3 is a block diagram of a differential amplifier, according to the invention, employing both the common mode rejection and input impedance features of FIG. 1 and a number of floating stages referenced to the common mode input voltage to keep the first stage collector to emitter voltages independent of the common mode voltage input; and FIG. 4 is a schematic diagram of an amplifier employing the improved common mode performance features of the invention.

Turning now to the drawings, the basic amplifier scheme is shown in FIG. 1, employing a forward path differential mode amplifier 10 having both common mode gain $G_{c1}$ and differential mode gain $G_{d1}$ and feedback networks 12 and 14 having differential mode transfer functions $H_a$ and $H_b$, respectively, and common mode transfer functions $H_c$. Amplifier 10 has output terminals 16 and 18 and input summing junctions 20 and 22. Network 12 is connected from terminal 16 to summing junction 20 and network 14 is connected from terminal 18 to summing junction 22, both in a negative or subtractive sense. A common mode amplifier 24, forming a common mode feedback path, having a gain $G_2$, is connected between a summing junction 26 of two summing resistors 28 and 30 having resistances $R_a$ and $R_b$ respectively, and two input summing junctions 32 and 34 in a negative sense, and is referenced to ground. Summing resistors 28 and 30 are connected in series across output terminals 16 and 18. Output terminal 36 is referenced to ground. Summing junctions 32 and 34 are connected to summing junctions 20 and 22 respectively, in a positive sense. The circuit has inputs $V_{ai}$ and $V_{bi}$ applied in a positive sense to summing junctions 32 and 34, respectively, and outputs $V_{ao}$ and $V_{bo}$ on terminals 16 and 18 respectively.

For the amplifier of FIG. 1, the differential mode (DM) transfer function, considering either side of the symmetrical circuit, is:

$$\frac{V_{do}}{V_{di}}=\frac{G_{d1}}{1+H_dG_{d1}} \quad (1)$$

where $$V_{di}=\frac{V_{ai}-V_{bi}}{2} \quad (2)$$

$$V_{do}=\frac{V_{ao}-V_{bo}}{2}=V_{ao}=-V_{bo} \quad (3)$$

$$G_{d1}=\text{DM gain of amplifier 10} \quad (4)$$

$$H_d=\text{DM gain of } H_a=\text{DM gain of } H_b \quad (5)$$

The common mode (CM) transfer function, considering the "-folded together" halves of the symmetrical circuit together with amplifier 24, is likewise $$\frac{V_{co}}{V_{ci}}=\frac{G_{c1}}{1+(H_c+G_2)G_{c1}} \quad (6)$$

where $$V_{co}=\frac{V_{ao}+V_{bo}}{2} \quad (7)$$

and $$V_{ci}=\frac{V_{ai}+V_{bi}}{2} \quad (8)$$

$$G_{c1}=\text{CM gain of amplifier 10} \quad (9)$$

$$G_2=\text{gain of amplifier 24} \quad (10)$$

$$H_c=\text{CM gain of } H_a \text{ or } H_b \quad (11)$$

If $H_{d1}$ $G_{d1}$ >>1, as is the usual low frequency case then (1) simplifies to $$V_{do}/V_{di}{**}1/H_d \quad (12)$$

Likewise if $G_2>>H_c$, and $G_2G_{c1}>>1$ then (6) simplifies to $$V_{co}/V_{ci}{**}1/G_2 \quad (13)$$

Whereas in the conventional circuit (where $G_2=0$) the corresponding equation, if $G_{c1}H_c>>1$, would be $$V_{co}/V_{ci}=1/H_C \quad (14)$$

Comparing equations (13) and (14) shows that the common mode rejection, defined as, $$CMR=\frac{V_{ci}}{V_{co}}\times\frac{1}{H_d} \quad (15)$$

is $H_c/H_d$ for the conventional circuit and $G_2/H_d$ for the circuit of FIG. 1. Another way of stating this is that the CMR of the conventional circuit is $H_c$ times DM gain setting, where $H_c \leq 1$, and the CMR of the circuit of FIG. 1 is $G_2$ times DM gain setting.

FIG. 2 shows the summing junctions of FIG. 1 in greater detail. Like components are given the same numbers as in FIG. 1. The components which determine $H_c$ are the feedback resistors 13 and 15 ($R_{fa}$ & $R_{fb}$), and the tail resistors 38 and 40 ($R_{ta}$ & $R_{tb}$). The components which determine $H_d$ are the feedback resistors 13 and 15, tail resistors 38 and 40, and the DM resistor 42 ($R_G$). Letting $R_{fa}=R_{fb}=AwR_f$ (16)

$R_{ta}=R_{tb}=AwR_t$ (17)

$H_c$ and $H_d$ are $$H_c=\frac{R_t}{R_t+R_f} \qquad (18)$$

$$H_d=\frac{R_t\left|\left|\frac{R_G}{2}\right.\right.}{\left(R_t\left|\left|\frac{R_G}{2}\right.\right.\right)+R_f} \qquad (19)$$

where|| means in parallel with. The DM input impedance is $$Z_{di}=\beta_1 GAd1H_d(R_f||R_G/2||R_t) \qquad (20)$$

where $\beta_1$ is the current gain of each input transistor 44 and 46 ($\beta_{1a}$ and $\beta_{1b}$ respectively).

The DM input impedance across the input terminals is twice the value indicated by equation (20).

The common mode input impedance is likewise $$Z_{ci}=\beta_1(G_{c1}G_2+G_{c1}H_c+1)(R_f||R_t) \qquad (21)$$

where the $G_{c1}H_c$ and 1 terms can be neglected.

This points to another advantage of the circuit of FIG. 1; without $G_2$ the common mode input impedance would be merely $$Z_{ci}=\beta_1(G_{c1}H_c a0z1)(R_f||R_t) \qquad (22)$$

Summarizing thus far, the presence of $G_2$ in FIG. 1 increases both the CMR and $Z_{ci}$ by a factor of $G_2/H_c$, or $$\frac{(R_f+R_t)}{R_t}G_2',$$

(where $G_2'$ is the gain of the amplifier 48 of FIG. 2).

In order to realize the maximum benefit of this potentially large increase in CMR and $Z_{ci}$, two items must be given attention;

1. conversion of CM signal to DM signal must be minimized, and

2. CM input impedance via paths other than that described above must be minimized.

If the resistors 13, 15, 38 and 40 are accurately matched, the worst offender of item (1) above is the changing first stage collector voltage. If the collector supply voltages were ground-referenced, the collector voltages with respect to ground would change only by a small amount but the emitters follow the common mode input signal, $V_{ci}$, to produce a collector to emitter voltage change of essentially $-V_{ci}$. This changing collector to emitter voltage would change transistor parameters by possibly different amounts, and possibly unbalance the first stage to produce a DM signal.

The worst offender of item (2) above is the first stage base to collector capacitance. Virtually the full common mode input signal would appear across this capacitance, so this impedance is in parallel with $\beta_1 G_{c1} G_2 (R_f||R_t)$ of equation (21).

The solution to both items (1) and (2) above is to drive the first low level stage reference points at the voltage $V_{ci}$ (plus the required DC operating voltages). This keeps the first stage collector to emitter voltages virtually independent of $V_{ci}$. This modification is shown in FIG. 3. The conversion from the floating first stages to the grounded referenced last stages occurs in the collector circuit of a common emitter intermediate stage. Again, common components are given the same numerals.

Referring to FIG. 3, because of the strong differential mode and common mode gain, and the feedback from the differential mode outputs over networks 12 and 14, and the common mode output feedback from terminal 26 through amplifier 24 to summing junctions 50 and 52, the points 54 and 56, which are in the emitter circuits of the differential transistors in the first differential stage of first stages 58, follow the signal at the input terminals 60 and 62, respectively. The junction 64 therefore follows the common mode input signal. The voltage at this point is always below the actual common mode input voltage by about 0.6 volt, which is made up of about 0.5 volt from the average of the base-emitter voltage drops ($V_{be}$) of the transistors in the input stage of first stages 58, and the remaining due to base current in the input transistor of power amplifier 66 and series emitter resistors in the first stage of 58. The output of amplifier 66, which has a gain of 1, then follows the common mode input signal and this voltage drives the negative output terminal of the DC power supply 68 to provide a supply voltage point. Power supply 68 moves in sympathy with the common mode input signal with the result that the collector to emitter voltage of the transistors in the first stage of stages 58 are virtually unchanged by a common mode input signal, with the result that the base to collector capacities of these transistors are not factors in determining the common mode input impedance. Also, there is no change in these transistors due to the presence of the common mode signal, as there would be if the collectors were signal-referenced to ground, which prevents the common mode voltage from generating a differential mode signal when the transistors have current gains which are functions of their collector voltages. The last stages 70 of the amplifier, employ a power supply 72, which is referenced to ground. The conversion from first stages 58 to last stages 70 may be made in the collector circuit of a common emitter intermediate stage.

Turning now to FIG. 4, which shows a complete circuit of one embodiment of the invention, operation is as follows:

A DM signal to be amplified is applied across input terminals 100 and 102. Any CM signal (which is common to both terminals, with respect to ground) must be rejected to a suitable extent. How this rejection occurs will be explained later.

A DM signal appearing across terminals 100 and 102 is amplified by a first differential amplifier stage which consists of transistors 104 and 106, emitter resistors 108—126, and collector resistors 128, 130 and 132. The resistor 132 is a potentiometer with its wiper connected to a bus 133. Resistors 110 are selected by section 134 of an overall DM gain selection switch.

The DM signal is amplified and appears between the bases of transistors 136 and 138, which are used in conventional emitter follower circuits. Resistors 140 and 142 establish the quiescent emitter current level and are connected to a bus 141 and resistor 143 serves as a common collector resistor and is connected to bus 133.

The DM signals now appear, slightly attentuated, between the bases of transistors 144 and 146, which form another conventional differential amplifier stage. Forward biased diodes 148 connected from bus 141 in series with variable resistor 149, provide the required emitter voltage levels by selectively connecting the emitters to opposite ends of resistor 149 and adjusting its wiper. The collector resistors are 150 and 152 again connected to bus 133. Capacitors 154 and 156 help determine the frequency response of the forward path DM amplifier, so that the closed loop, to be described later, will be stable.

The DM signal further amplified, now appears between the bases of transistors 158 and 160, which are emitter followers. Resistors 162 and 164 establish the quiescent current and are connected to bus 141 and the collectors are connected to bus 133. The DM signal, therefore, appears slightly attentuated between the bases of transistors 166 and 168, which form another conventional differential amplifier stage. Emitter resistors 170 and 162 are differentially shunted by resistors 174, depending on the position of the DM gain switch section 176 and are connected to bus 133. This switching controls the forward path DM gain to permit stable closed loop operation. Collector resistors are 178 and 180 and are connected to a source of negative potential on bus 181.

The amplified DM signal appears across the bases of transistors 182 and 184, which form the last forward path DM amplifier stage. Zener diode 186, connected from bus 181 through resistor 187 to a source of positive potential on bus 189, establishes the emitter operating voltage. Collector resistors are 188 and 190, also connected to bus 189. Resistors 192 and 194, and capacitors 196 and 198, help determine closed loop stability. Forward biased diodes 200 and 202 provide a DC voltage drop so that the signal at the collector of transistor 184 can properly drive a conventional complementary emitter follower stage composed of transistors 204 and 206 and resistors 208, 210, 212 and 214. The signal at the collector of transistor 182 is applied to the base of transistor 216, a conventional emitter follower with emitter resistor 218 connected to bus 181 and collector resistor 219 connected to bus 189.

The fully amplified DM signal appears between output point 220 and the complementary output point at the emitter of transistor 216. These two points are fed back through resistors 126 and 124, respectively, to the emitter circuits of transistors 106 and 104 to complete the negative DM feedback path.

The forward path DM gain is on the order of $10^4$ greater than the desired overall DM gain, so the overall DM gain is determined to a high degree of accuracy by the feedback networks, which include resistors 108 through 126.

With the DM signal path having been described, the CM path will now be followed. The CM signal, if any, appears at both input terminals 100 and 102 with respect to ground. The DM amplifier stages previously described for DM signal amplification also amplify the CM signal, but to a lesser extent. The resistors 110, 116 and 118 cause the first stage (transistors 104 and 106) to have a CM gain which is less than its DM mode gain. The dynamic impedance of diodes 148 cause the stage of transistors 144 and 146 to have less CM gain. The dynamic impedance of the Zener diode 186 likewise reduces the CM gain of the stage employing transistors 182 and 184. This smaller CM gain is not necessarily a major feature, but does influence design for stability.

The amplified CM signal now appears at output point 220 and at the emitter of transistor 216, as does the amplified DM signal. At the summing junction 222 of summing resistors 224 and 226, only the amplified CM signal appears. The amplified DM signal is equal and opposite at the opposite ends of resistors 224 and 226, and since these resistors are of equal value, no DM signal appears at junction 222 which forms a common mode output point.

The amplified CM signal now appears at the base of transistor 228, which is one-half of a differential amplifier stage. Transistor 230 is the other half, and may have its base referenced to ground as shown.

Resistor 232 is the common emitter resistor of the differential amplifier stage containing transistors 228 and 230, and is connected to a source of negative potential on bus 233 which is tied (not shown) to bus 181. Resistors 234 and 236 are the collector resistors which are connected to a source of positive potential on bus 237 which is tied (not shown) to bus 189. Resistor 240 and capacitor 244 are selected for CM closed loop stability.

The amplified CM signal now appears between the bases of transistors 246 and 248, which comprise another differential amplifier stage with common emitter resistor 250 connected to bus 237. Resistor 252 is in the collector circuit of transistor 248 and is connected to bus 233.

The further amplified CM signal now appears at the base of transistor 254, which, together with transistor 246, forms a bidirectional output at its collector and has an emitter resistor 256 to establish its quiescent current connected to bus 233. The fully amplified CM signal is now applied from between the collectors of transistors 254 and 246 to the tail resistors 120 and 122 to complete the CM negative feedback path.

Because of this feedback path, it can now be seen that the voltage at the tail resistors 120 and 122 will vary in direct proportion to the CM input signal. The value of this proportion is determined by resistors 120, 122, 124 and 126, and a representative value is 1.4. The value of the CM signal appearing at the junction 222 must therefore be this value divided by the gain of the CM amplifier, which starts at the base of transistor 228 and ends at the collector of transistor 254.

Now that the DM signal path and the CM signal path have been followed, other components will be described. Because of the strong DM and CM gain and feedback, the emitter of transistor 104 virtually follows the signal at the input terminal 100, and the emitter of transistor 106 virtually follows the signal at input terminal 102. The junction of resistors 116 and 118 therefore follows the CM input signal to provide a point in the first stage emitter circuit at which changes in CM input voltages appear. The voltage at this point is always below the actual CM input voltage by about 0.6 volts. Of this 0.6 volts, about 0.5 volts is the average of the $V_{be}$ drops of transistors 104 and 106, approximately 0.05 volts is due to transistor 258 base current in resistors 116 and 118, and the remainder is due to drops in resistors 108, 112 and 114.

Transistors 258 and 260 form a Darlington emitter follower circuit, providing a power amplifier with emitter resistor 262 connected to bus 233 determining the quiescent current in transistor 260 and their collectors connected to bus 237. The power amplifier is provided in order to drive the supply voltage points on buses 141 and 133 without loading down the emitter circuit of the transistors 104 and 106. Resistor 264 raises the CM signal at the base of transistor 258 to slightly greater than the CM input signal so that the signal at the emitter of transistor 260 substantially equals the CM input signal. From a voltage standpoint, the emitter of transistor 260 and bus 141 to which it is connected, is always about 1.2 volts below the base of transistor 258 due to the $V_{be}$ drops of transistors 258 and 260, or about 1.8 volts below the CM input signal and provides a supply voltage point driven by the input common mode voltage.

The diode chain comprising diodes 148, 266, 268, 270, 272, and resistor 149, connected between the emitter of transistor 260 and the collector of transistor 274, has a constant current existing in it and therefore has a substantially constant voltage across it to provide a substantially constant voltage source for a substantially fixed bias level which only varies in minor respects due to temperature variations. Transistor 274 having its collector connected to bus 133 is a buffer for the current source which is made up of transistors 276 and 278, with resistors 280 and 282 determining the collector voltage of transistor 278. The value of the current output of the current source, or the collector current of transistor 274 is determined primarily be the voltage across Zener diode 186 and the values of resistors 283, 285 and 287.

Both ends of the diode chain have a signal equal to the CM input signal, with the upper end at bus 133 providing a supply voltage point 5 volts more positive than the CM input signal, and the lower at bus 141 providing a supply voltage point 1.8 volts more negative than the CM input signal.

As the diode chain moves in sympathy with the CM input signal, the operation of the amplifier stages is not affected; the only significant effect is that the collector to emitter voltage of transistor 104, and the collector to emitter voltage of transistor 106, are virtually unchanged by a CM input signal. This means that the base to collector capacities of transistors 104 and 106 are not factors in determining CM input impedance. It also means that there is no change in the transistor 104 and 106 parameters due to the presence of a CM signal, as there would be if their collectors were signal referenced to ground. This prevents a CM voltage from generating a DM signal when transistors 104 and 106 have current gains which are functions of their collector voltages.

It will be obvious that the number of differential voltage amplifying stages is not critical and that the stage including transistors 166, 168, which is the conversion stage between the floating and grounded stages, could be in a configuration such as a common base stage and that either the emitters as shown or a different pair of like electrodes in the conversion stage could be referenced to a supply voltage point such as bus 133.

The remaining connections from the diode chain to the collector circuit of transistors 104 and 106 are for input current compensation and temperature compensation, and are described in the copending application of William E. Shoemaker Ser. No. 496,791 entitled "Direct Coupled Differential Transistor Amplifier With Improved Offset Voltage Temperature Coefficient and Method of Compensation", filed concurrently herewith, and assigned to the assignee of the present invention.

Since the principles of the invention have now been made clear, modifications which are particularly adapted for specific situations without departing from those principles will be apparent to those skilled in the art. The appended claims are intended to cover such modifications as well as the subject matter described and to only be limited by the true spirit of the invention.

We claim:

1. A differential amplifier having high common mode rejection characteristics comprising:

first and second amplifier means connected in a differential configuration, each of said amplifier means having an input terminal and an output terminal, means for impressing first and second signals upon the input terminals of said first and second amplifier means, respectively, means connected to both said amplifier means for deriving a common mode signal, a floating power supply connected to the output terminals of said first and second amplifiers, and means for coupling said common mode signal to said power supply to drive each side of the power supply in a direction to minimize the common mode signal and simultaneously keep the voltage drop across each amplifying means constant.

2. A differential amplifier for amplifying the differential mode of a pair of input signals while simultaneously suppressing any common mode signal appearing therewith comprising:

first and second transistors connected in a differential configuration, each of said transistors having base, emitter and collector electrodes, means for impressing the first and second input signals, each of which is accompanied by a common mode signal, upon said base electrodes of said first and second transistors, respectively, means connected to said collector electrodes of said first and second transistors for driving the common mode signal, load impedance means in the collector circuit of said first and second transistors for deriving a differential output signal, a floating power supply, first means for connecting said power supply to said collector electrodes of each of said first and second transistors through said load impedance means, and means connected to said common mode signal deriving means for coupling said common mode signal to said floating power supply to drive the magnitude of the voltage appearing on said first means in a direction so as to minimize the common mode signal while simultaneously keeping the collector to emitter voltage of each transistor constant.

3. A differential amplifier as defined in claim 7 wherein said power supply comprises: a constant current source, and a voltage dividing means connected to said constant current source and between said first means and said coupling means wherein the current supplied by said constant current source flows through said voltage dividing means to provide a predetermined bias voltage.

4. A differential amplifier as defined in claim 2 wherein said means for deriving the common mode signal comprises a resistive summing network connected to the collector electrodes of said first and second transistors.

5. A differential amplifier as defined in claim 4 wherein said coupling means includes an amplifier connected between said resistive summing network and the emitter electrodes of said first and second transistors for coupling said common signal to said emitter electrodes.

6. A differential amplifier for amplifying the differential mode of first and second input signals while simultaneously suppressing common mode signals accompanying said input signals and whose amplitude varies with respect to a selected reference point comprising:

first and second transistors connected in a differential configuration, each of said transistors having base, emitter and collector electrodes, said first input signal being impressed upon the base electrode of said first transistor and said second input signal being impressed upon the base electrode of said second transistor, load impedance means connected to said collector electrodes of said first and second transistors across which a differential output signal is developed, first means connected to said emitter electrodes of said first and second transistors to derive the common mode signal, a floating power supply, connecting means for connecting one side of said floating power supply to the collector electrodes of each of said transistors through the load impedance means, means connected between said first common mode signal deriving means and said floating power supply to couple the common mode signal to the other side of the floating power supply to drive the voltage appearing on said connecting means with respect to said reference point in a direction to minimize the common mode signal while simultaneously keeping the collector to emitter voltage across each transistor constant.

7. A differential amplifier as defined in claim 6 comprising in addition second means coupled to the collector electrodes of said first and second transistors to derive the common mode signal and amplifier means connected between said second means and said emitter electrodes of said first and second transistors and responsive to said common mode signal to vary the collector current in said first and second transistors to compensate for the common mode signal.

8. A differential amplifier as defined in claim 7 wherein said floating power supply comprises a constant current source and a voltage dividing means connected to said constant current source and between said connecting means and said common mode signal coupling means.

9. A differential amplifier as defined in claim 2 wherein said means for deriving a common mode signal comprises a resistive summing network connected to the emitter electrodes of said first and second transistors.

10. A differential amplifier as defined in claim 9 wherein said coupling means comprises an emitter follower circuit connected between said resistive summing network and one side of said floating power supply.

11. A multistage differential amplifier for amplifying the differential mode of first and second input signals while simultaneously suppressing common mode signals accompanying said input signals comprising:

first and second differential amplifier stages, each stage comprising first and second transistors connected in a differential configuration, each of said transistors having base, emitter and collector electrodes, said first input signal being impressed upon the base electrode of said first transistor in said first stage and said second input signal being impressed upon the base electrode of said second transistor in said first stage, load impedance means connected to said collector electrodes of said first and second transistors of each stage across which a differential output signal is developed, means for connecting the collector electrodes of said first and second transistors in said first stage to the base electrodes of said first and second transistors, respectively, in said second stage, first common mode signal deriving means connected to said emitter electrodes of said first and second transistors of said first stage to derive the common mode signal, a floating power supply, a first means for connecting said floating power supply to the collector electrodes of each of said transistors in each stage through the load impedance means, a second means for connecting said floating power supply to said emitter electrodes of each of said transistors in said second stage, and means connected between said first common mode signal deriving means and said floating power supply to couple the common mode signal to said second connecting means to drive each side of the power supply in the same direction to minimize the common mode signal while simultaneously maintaining the collector to emitter voltage across each transistor in each stage constant.

12. A multistage differential amplifier as defined in claim 11 comprising in addition a second common signal deriving means connected to said collector electrodes of said first and second transistors in said second stage to derive the common mode signal and amplifier means connected between said second common mode signal deriving means and said emitter electrodes of said first and second transistors in said first stage.

PO-1050
(5/69)

UNITED STATES PATENT OFFICE
CERTIFICATE OF CORRECTION

Patent No. 3582802 Dated June 1, 1971

Inventor(s) Barret B. Weekes and William E. Shoemaker

It is certified that error appears in the above-identified patent and that said Letters Patent are hereby corrected as shown below:

Column 7, line 52, change "driving" -- to read -- deriving --

Column 7, line 69, change "7" -- to read -- 2 --

Signed and sealed this 21st day of December 1971.

(SEAL)
Attest:

EDWARD M.FLETCHER,JR.
Attesting Officer

ROBERT GOTTSCHALK
Acting Commissioner of Patents